United States Patent [19]
Jiang et al.

[11] Patent Number: 6,011,307
[45] Date of Patent: Jan. 4, 2000

[54] ANISOTROPIC CONDUCTIVE INTERCONNECT MATERIAL FOR ELECTRONIC DEVICES, METHOD OF USE AND RESULTING PRODUCT

[75] Inventors: Tongbi Jiang, Boise; Zhiqiang Wu; David Kao, both of Meridian; Rongsheng Yang, Boise, all of Id.

[73] Assignee: Micron Technology, Inc., Boise, Id.

[21] Appl. No.: 08/909,683

[22] Filed: Aug. 12, 1997

[51] Int. Cl.[7] ................................................ H01L 29/43
[52] U.S. Cl. .......................... 257/746; 438/610; 257/741
[58] Field of Search .................................. 438/610, 618, 438/637; 257/746, 741, 778

[56] References Cited

U.S. PATENT DOCUMENTS

| | | |
|---|---|---|
| 4,448,837 | 5/1984 | Ikeda et al. . |
| 4,548,862 | 10/1985 | Hartman . |
| 4,644,101 | 2/1987 | Jin et al. . |
| 4,737,112 | 4/1988 | Jin et al. . |
| 4,838,347 | 6/1989 | Dentini et al. . |
| 4,923,739 | 5/1990 | Jin et al. . |
| 5,087,494 | 2/1992 | Calhoun et al. . |
| 5,155,302 | 10/1992 | Nguyen et al. . |
| 5,258,577 | 11/1993 | Clements . |
| 5,284,779 | 2/1994 | Miyanaga . |
| 5,305,126 | 4/1994 | Kobayashi et al. . |
| 5,443,876 | 8/1995 | Koskenmaki et al. . |
| 5,468,681 | 11/1995 | Pasch . |
| 5,478,007 | 12/1995 | Marrs . |
| 5,522,962 | 6/1996 | Koskenmaki et al. . |
| 5,769,996 | 6/1998 | McArdle et al. . |

OTHER PUBLICATIONS

V.E. Gul et al. "Formation of electrically conductive structures in a polymeric material under the action of a magnetic field," *Soviet Plastics*, No. 4, pp. 51–54 (Apr. 1966).

*Primary Examiner*—Caridad Everhart
*Attorney, Agent, or Firm*—Trask, Britt & Rossa

[57] ABSTRACT

Conductive interconnections are formed by depositing an adhesive material, made up of ferromagnetic particles dispersed within a matrix material, on a semiconductor substrate, such as an electronic component, and applying a magnetic field between an exposed surface of the adhesive material and an attached surface of the adhesive material (abutting the semiconductor substrate), such that a plurality of the ferromagnetic particles move and align within the matrix material under the influence of the magnetic field. One method of the present invention comprises depositing the adhesive material on a contact site of a first electronic component. A second electronic component having a contact site is aligned over the adhesive material and a magnetic field is applied between the first electronic component and the second electronic component. The first electronic component and the second electronic component are then pressed together such that a portion of the plurality of the ferromagnetic particles makes electrical contact with both the first electronic component bond pad and its corresponding second electronic component bond pad.

38 Claims, 9 Drawing Sheets

ANISOTROPIC CONDUCTIVE INTERCONNECT MATERIAL FOR ELECTRONIC DEVICES, METHOD OF USE AND RESULTING PRODUCT

BACKGROUND OF THE INVENTION

1. Field of the Invention

The present invention relates to forming a conductive interconnection between electronic devices. More particularly, the present invention relates to forming a conductive interconnection from a matrix material having ferromagnetic particles dispersed therein, wherein the ferromagnetic particles are aligned to make electrical contact between the electronic devices.

2. State of the Art

A flip chip is a semiconductor chip or die that has bumped terminations spaced around an active surface of the semiconductor die and is intended for face-to-face attachment to a carrier substrate or another semiconductor die. The bumped terminations of the flip chips are usually a "Ball Grid Array" ("BGA") configuration wherein an array of minute solder balls is disposed on an attachment surface of a semiconductor die, or a "Slightly Larger than Integrated Circuit Carrier" ("SLICC") configuration wherein minute solder balls are disposed on an attachment surface of a semiconductor die in an arrangement similar to a BGA, but having a smaller solder ball pitch (spacing) and diameter than a BGA.

The attachment of a flip chip to a substrate or another semiconductor involves aligning the solder balls on the flip chip with a plurality of contact points on a facing surface of the carrier substrate. Flip chip attachment requires the formation of contact terminals on flip chip contact sites, each consisting of a metal bond pad with a lead/tin solder ball disposed thereon. Flip chip attachment also requires the formation of solder joinable sites ("terminal pads") on the metal conductors of the carrier substrate, such as a printed circuit board ("PCB"), which terminal pads are patterned in a mirror-image of the solder balls arranged on the flip chip. A plurality of solder balls may also be formed on the facing surface of the substrate at the contact points. A quantity of liquid solder flux is often applied to the face of the chip and/or substrate, and the chip and substrate are subjected to elevated temperature to effect reflowing of the solder balls on the chip and/or corresponding solder balls on the substrate to effect electrical connection between the two components. The terminal pads on the substrate are usually surrounded by barriers of non-solderable/non-wettable material so that when the solder of the bond pads and of the chip contact sites melts and merges ("reflows"), surface tension supports the semiconductor chip by liquified solder columns above the substrate. After cooling, the chip is essentially welded face-down by these very small, closely spaced solder column interconnections. This connection technology is also referred to as "flip chip attachment" or "C4—Controlled Collapse Chip Connection."

High performance microelectronic devices generally comprise a number of flip chips, attached to a substrate or printed circuit board ("PCB") for electrical interconnection to other microelectronic devices. For example, a very large scale integration ("VLSI") chip may be electrically connected to a carrier substrate, such as a printed circuit board, or to other higher level packaging.

However, as electronic devices become smaller, the size requirements for semiconductors and the means for providing electrical connection between two semiconductors, between semiconductors and substrates, or between flexible circuits and rigid printed circuits become increasingly demanding by requiring precise electrical connections at extremely fine pitches. These demands have resulted in a growing interest in developing alternate methods for making electrical interconnections to replace solder balls. Among such alternate methods are the use of composite materials comprising conductive particles dispersed in a nonconductive material, such as polymers or resins, to form conductive bumps which are used as electrical interconnections in semiconductor structures between components bearing contact pads.

U.S. Pat. No. 5,258,577 issued Nov. 2, 1993 to Clements relates to a substrate and a semiconductor die with a discontinuous passivation layer. The discontinuities result in vias between the contact points of the substrate and the semiconductor die. A resin with spaced conductive metal particles suspended therein is disposed within the vias to achieve electrical contact between the substrate and the semiconductor die. U.S. Pat. No. 5,468,681 issued Nov. 21, 1995 to Pasch relates to interconnecting conductive substrates using an interposer having conductive plastic filled vias. U.S. Pat. No. 5,478,007 issued Dec. 26, 1995 to Marrs relates to using conductive epoxy as a bond pad structure on a substrate for receiving a coined ball bond on a semiconductor die to achieve electrical communication between the semiconductor die and the substrate.

Although the use of such conductive composite materials can achieve smaller sized and pitched interconnections, the conductive composite bumps require substantial quantities of conductive material dispersed therein. Stated another way, a relatively high percentage of conductive material, by volume, is required. Additionally, it is often difficult to achieve good electrical contact between the conductive composite bump and the contact pads because the polymers or resins used tend to surround the conductive material and curtail the ability to conduct between conductive particles. Thus, a good metal to metal interface may not be achieved by conductive composite bump.

Another method for making electrical interconnections is by the use of conductive films. These films may take a variety of forms and have been made having conductivity in one, two or three mutually perpendicular directions. With such films, it is customary to designate directions such that the x- and y-axis lie in the plane of the sheet or layer. Some such conductivity films have z-axis conductivity only, others have z- and y-axis conductivity, and isotropically conductive media have x-, y-, and z-axis conductivity (see, U.S. Pat. No. 4,923,739 issued May 8, 1990 to Jin et al.—two direction conductive sheet, and U.S. Pat. No. 4,548,862 issued Oct. 22, 1985 to Hartman—z-axis conductive tape).

Conductive films which can be used to replace solder bonding between two electronic components, as discussed above, are usually z-axis conductive films, wherein the z-axis conductive films may also physically bind the two electronic components together. Z-axis conductive films can be formed through a number of means, including dispersing ferromagnetic conductive particles throughout a viscous binder matrix, such as a non-conductive polymer or resin. Once the ferromagnetic conductive particles are dispersed, a magnetic field is applied to align the ferromagnetic particles into continuous conductive columns extending from a top surface of the binder matrix to a bottom surface of the binder matrix. Upon curing or otherwise hardening, the binder matrix will become an adhesive layer, an elastomeric layer, or another type of dielectric material, depending on the binder matrix used. Where electrical connection on a very fine pitch is required, the conductive columns may be placed only where the contact sites (e.g., terminal pads) are located, typically requiring indexing (i.e., precisely aligning) the conductive film to align the conductive columns with the contact sites, or the conductive columns may be formed with such close spacing, relative to the spacing of the contact sites, that indexing is not required.

Although conductive films have their advantages, having to index the conductive film is a time-consuming (and thus expensive) process. Furthermore, the fine pitched, non-indexed conductive films waste a great deal of conductive material, since only a small percentage of conductive columns in the conductive films actually perform the function of making the electrical contacts between the two electronic components.

Therefore, it would be advantageous to develop a technique for making an electrical interconnection between two electronic components which overcome the above disadvantages, while using inexpensive, commercially-available, widely-practiced semiconductor device fabrication techniques and apparatus without requiring complex processing steps.

SUMMARY OF THE INVENTION

The present invention is a method of forming conductive interconnections between electronic components and the resulting conductive interconnections. The method consists of providing an adhesive material made up of ferromagnetic particles dispersed within a matrix material. This adhesive material is deposited on a semiconductor substrate, such as an interconnection carrier or electronic component, and applying a magnetic field between an exposed surface of the adhesive material and an attached surface of the adhesive material (abutting the semiconductor substrate), such that the ferromagnetic particles move and align within the matrix material under the influence of the magnetic field.

In an exemplary method, the adhesive material is deposited on at least one contact site, such as a bond pad, on the surface of a first electronic component, such as a printed circuit board, a semiconductor wafer, a semiconductor chip, lead frame lead fingers, or the like, to form a column of adhesive material. The adhesive material column may be partially cured or otherwise hardened prior to electrical connection with a second electronic component.

The second electronic component, such as a printed circuit board, a semiconductor wafer, a semiconductor chip, lead frame lead fingers, or the like, having at least one contact site is aligned over the adhesive material columns. A magnetic field is applied between the first electronic component and the second electronic component, such that a plurality of the ferromagnetic particles move and align within the matrix material under the influence of the magnetic field. The ferromagnetic particles are of a size in at least one dimension to entirely bridge the gap between the two electronic components when placed together.

The first electronic component and the second electronic component are then pressed together such that a portion of the plurality of the ferromagnetic particles makes a predetermined degree of electrical contact with both the first electronic component contact site and its corresponding second electronic component contact site. The adhesive material is then fully cured (for thermoset-type resins), baked (for thermoplastic-type resins), or otherwise hardened to completely set the adhesive material.

The conductive interconnections may be formed prior to attachment to electronic components. The adhesive material of the present invention is deposited on an interconnection carrier comprising a carrier film, preferably having a layer of release material thereon. The adhesive material is preferably deposited through apertures of a stencil placed atop the release material. When the stencil is removed, adhesive material columns are formed. A magnetic field is applied between exposed surfaces of the material columns and attached surfaces (abutting the release material) of the adhesive material columns to align the ferromagnetic particles within the matrix material of the adhesive material. Preferably, the matrix material is then at least partially cured to maintain the alignment of the ferromagnetic particles within the matrix material. The interconnection carrier with the adhesive material columns may be placed in at least one degaussing mechanism which removes any residual magnetic field in the ferromagnetic particles. The interconnection carrier with the adhesive material columns may be placed on a first electronic component, such that at least one adhesive material column contacts at least one contact site on the first electronic component. The interconnection carrier is then removed and a second electronic component is aligned on the adhesive material columns, such that at least one adhesive material column contacts at least one contact site on the second electronic component. The first electronic component and the second electronic component are then pressed together, such that a portion of the plurality of the ferromagnetic particles makes a predetermined degree of electrical contact with both the first electronic component contact site and its corresponding second electronic component contact site.

The ferromagnetic particles are preferably elongated, comprising flakes or needle-shaped metal particles which contain electromagnetic dipoles that can be aligned when under the influence of the magnetic field. Alternately, polymeric flakes (such as polystyrene) coated with ferromagnetic metals or alloys may be used in lieu of the metal particles.

It is understood that, even in a random distribution of ferromagnetic particles within a matrix material, a certain number of ferromagnetic particles will randomly align and may make an electrical contact in an assembly. However, the present invention aligns the ferromagnetic particles well beyond a random distribution to ensure a sufficient electrical contact. Preferably, at least 15% of the ferromagnetic particles are aligned. Most preferably, at least 30% of the ferromagnetic particles are aligned. Such a degree of alignment should result in a predetermined degree of contactivity (electrical contact). The contactivity is dependent on a number variables including: the conductivity of the metal in the ferromagnetic particles, the degree of alignment achieved, the size of the contact areas (i.e., bond pad size), the amount of ferromagnetic particles in the matrix material, the dimension of the particles (i.e., thickness or thinness (diameter) of the elongate particles) wherein a thick particle may have a higher conductive capability than several thin particles, and the like. The "predetermined degree" of contactivity is, of course, a function of the required electrical signals for the components for which the electrical connection is being made. Since, the electrical signal requirements for the components will be known prior to the formation of the conductive interconnections, the properties of the adhesive material to achieve the required contactivity of the conductive interconnections can be adjusted accordingly.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DESCRIPTION OF THE PREFERRED EMBODIMENTS

FIGS. 1–8 illustrate cross-sectional views of methods of forming conductive interconnects between two electronic components according to the present invention. It should be understood that the figures presented in conjunction with this description are not meant to be actual views of any particular portion of an actual semiconductor device or other electronic component, but are merely idealized representations which are employed to more clearly and fully depict the process of the invention than would otherwise be possible. It is noted that elements common between each of FIGS. 1–10 retain the same numerical designation.

Figure 1:
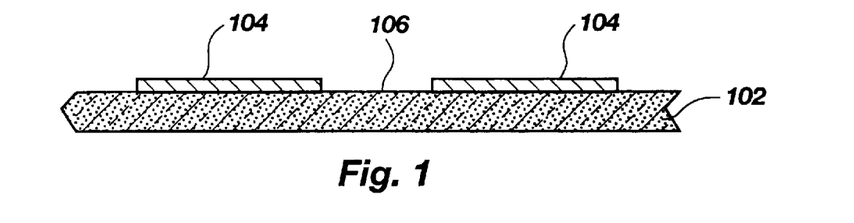
FIGS. 1–8 illustrate cross-sectional views of methods of fabricating a conductive interconnection between two electronic components according to the present invention.
Figure 2:
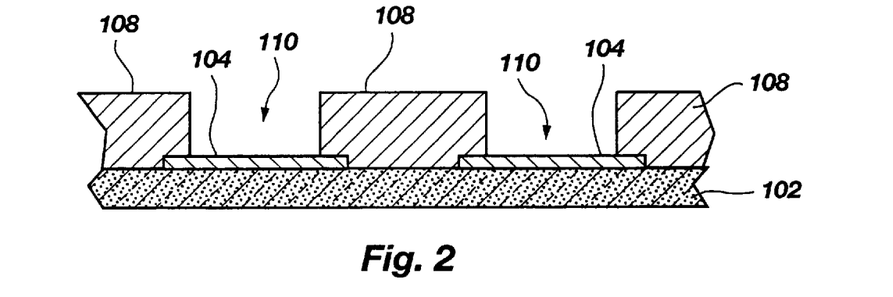
Figure 3:
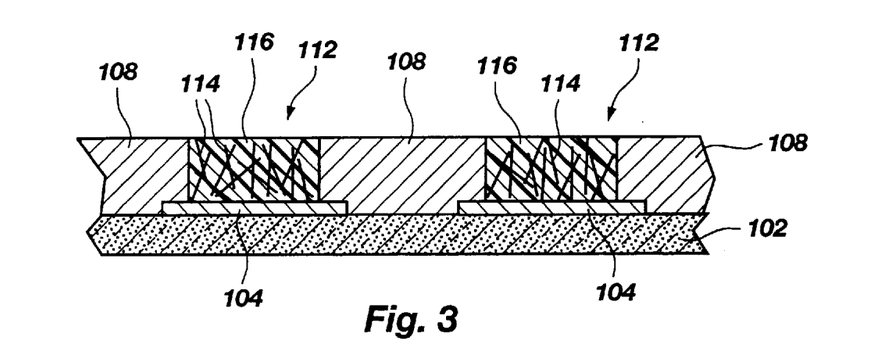
Figure 4:
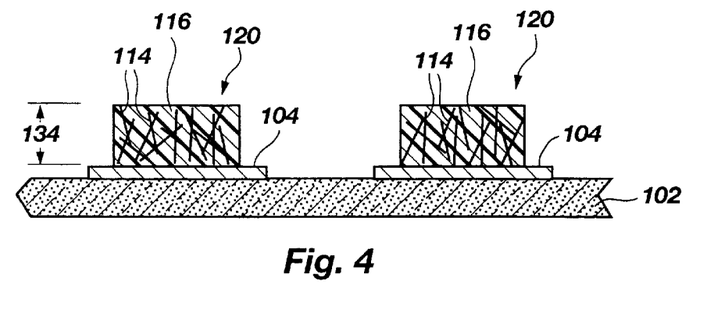
Figure 5:
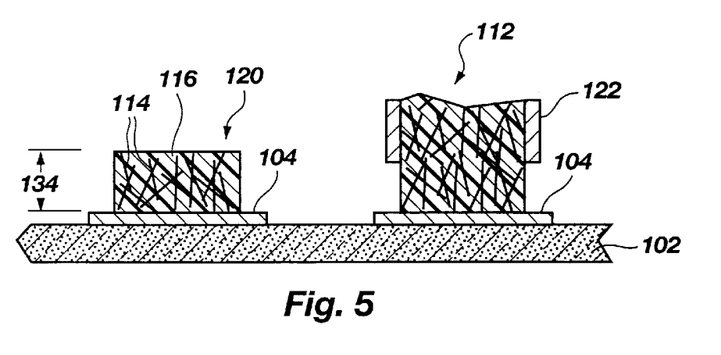

FIG. 1 illustrates a first electronic component 102, such as a printed circuit board, a semiconductor wafer, a semiconductor chip, or the like, having at least one contact site, such as a bond pad 104, on an attachment surface 106 of the first electronic component 102. A stencil 108 may be placed atop the first electronic component attachment surface 106 with at least one stencil aperture 110 aligned over at least one first electronic component bond pad 104, as shown in FIG. 2. An adhesive material 112, comprising ferromagnetic particles 114 dispersed within a matrix material 116, is deposited into the stencil apertures 110, such as by screen printing or spraying, as shown in FIG. 3. The stencil 108 is removed, thereby forming adhesive material columns 120, as shown in FIG. 4. If necessary, the adhesive material 112 may be allowed to partially cure or otherwise harden prior to the removal of the stencil 108. Of course, the adhesive material 112 may also be partially cured or otherwise hardened after the removal of the stencil 108. It is understood that a variety of methods could be employed to form adhesive material columns 120, such as directly extruding the adhesive material 112 from an extrusion nozzle 122, as shown in FIG. 5.

Figure 6:
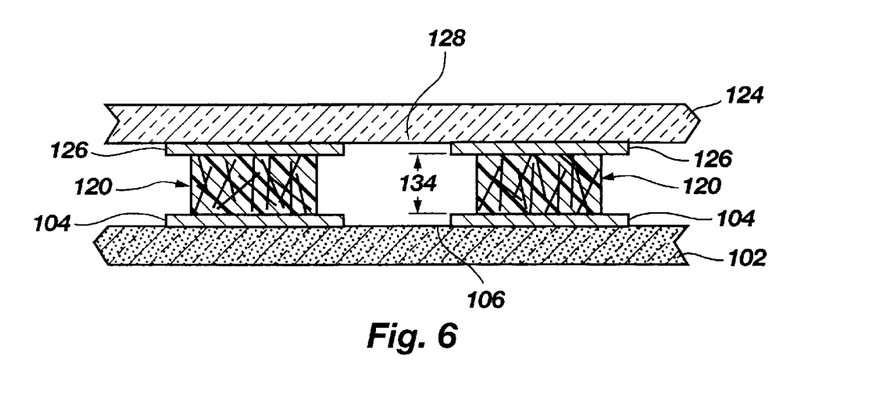
Figure 7:
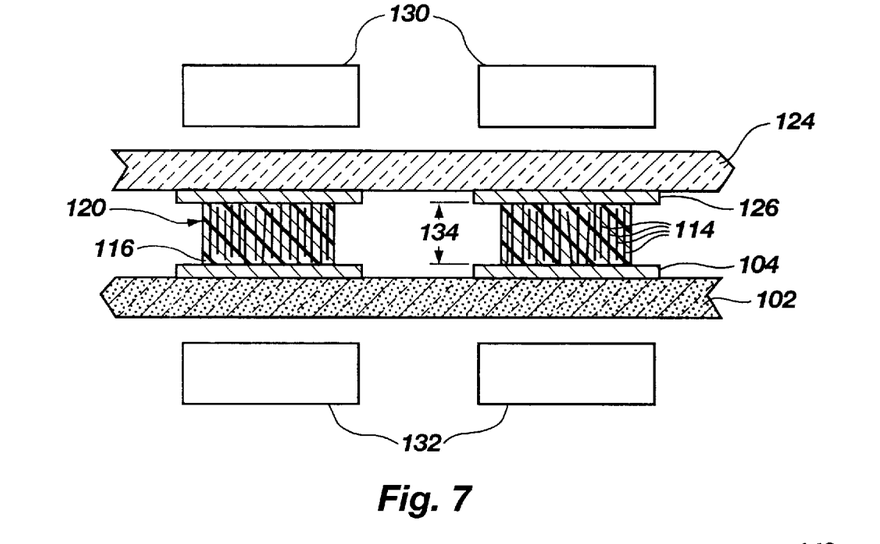

A second electronic component 124, such as a printed circuit board, a semiconductor wafer, a semiconductor chip, or the like, having at least one contact site, such as a bond pad 126, on an attachment surface 128 of the second electronic component 124 is then aligned over the adhesive material columns 120, as shown in FIG. 6. A magnetic field is applied between the first electronic component 102 and the second electronic component 124, such as by at least one first magnetic pole 130 and at least one second, opposing magnetic pole 132, to align the ferromagnetic particles 114 within the matrix material 116, as shown in FIG. 7. The magnetic field must be sufficiently strong and the matrix material 116 must be of sufficiently low viscosity such that the ferromagnetic particles 114 can move and preferentially align within the matrix material 116 under the influence of the magnetic field. The strength of the magnetic field can be varied, depending on the viscosity of the matrix material 116, or vice versa. It is, of course, understood that the adhesive material 112 may be heated prior to or during magnetic alignment to decrease the viscosity of the matrix material 116 to facilitate particle alignment.

Figure 8:
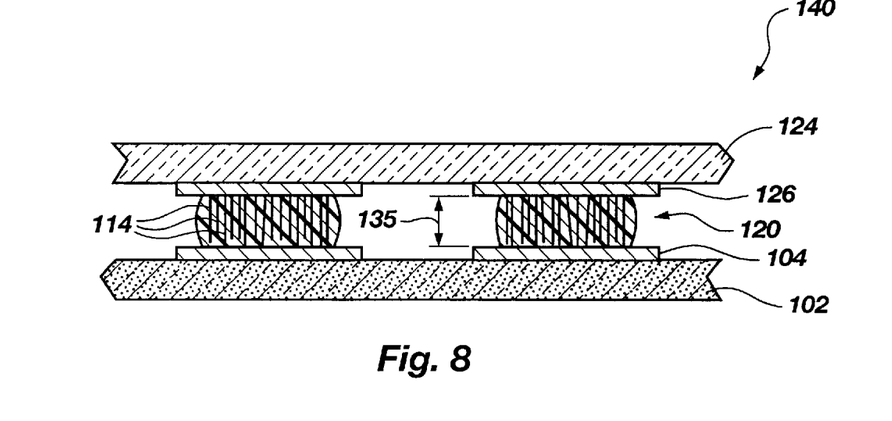

The first electronic component 102 and the second electronic component 124 are then pressed together such that a plurality of the ferromagnetic particles 114 of each adhesive material column 120 contacts or even slightly penetrates each first electronic component bond pad 104 and its corresponding second electronic component bond pad 126 to make a predetermined degree of electrical connection therebetween to form structure 140, as shown in FIG. 8. The alignment of the ferromagnetic particles 114 perpendicular to the planes of the bond pads 104 and 126 is particularly important with bond pads made of aluminum because a non-conductive film layer of aluminum oxide ($Al_2O_3$) inherently forms on the exposed surface of the bond pad. Thus, the ferromagnetic particles 114 must poke through the aluminum oxide surface film to make electrical contact with the underlying aluminum metal of the bond pad. The structure 140 may then be fully cured (for thermoset-type resins), heated and cooled (for thermoplastic-type resins), baked, or otherwise hardened to completely set the structure 140.

Figure 9:
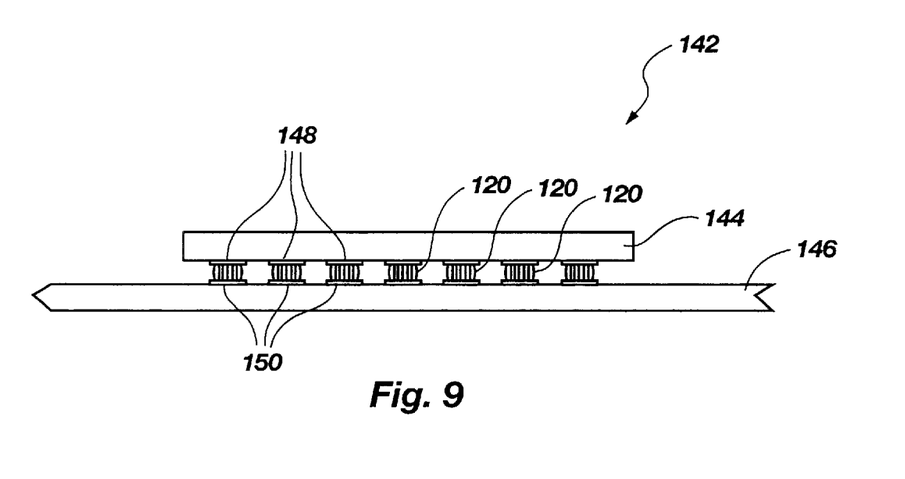
FIG. 9 illustrates a side plan view of a flip-chip attached to a printed circuit board.

FIG. 9 illustrates an exemplary assembly 142 employing the present invention, wherein a flip-chip 144 is attached to a printed circuit board 146. The flip-chip 144 has a plurality of bond pads 148 which is aligned with a plurality of terminal pads 150 in a mirror-image configuration on the printed circuit board 146. The flip-chip 144 and printed circuit board 146 are attached and placed in electrical communication with one another using the conductive, ferromagnetic particle-filled adhesive material 112 and the method of the present invention.

Figure 10:
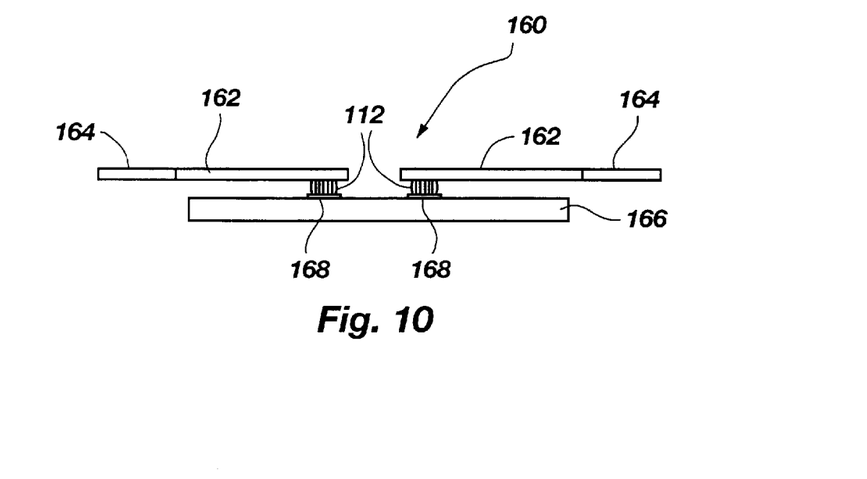
FIG. 10 illustrates a side cross-sectional view of a lead-over-chip attachment configuration using a method of the present invention.

FIG. 10 illustrates a lead-over-chip assembly 160 employing the present invention. Lead fingers 162 of a lead frame 164 extend over a semiconductor die 166 to align with bond pads 168. The lead fingers are attached and in electrical communication with the semiconductor die 166 using the adhesive material 112 and the method of the present invention.

Figure 11:
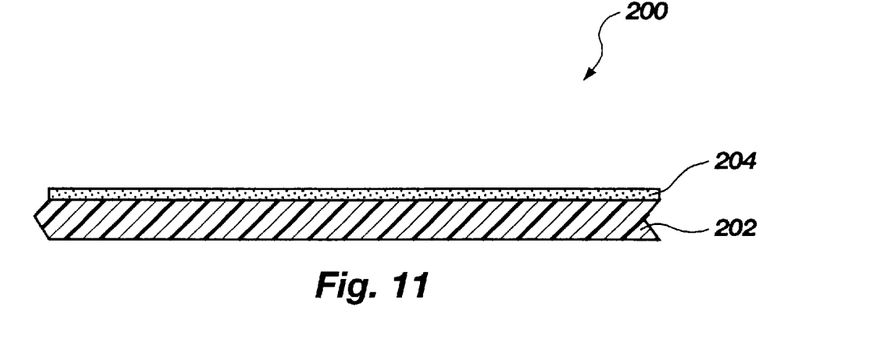
FIGS. 11–20 illustrate cross-sectional views of an alternate method of forming a conductive interconnection utilizing an interconnection carrier.
Figure 12:
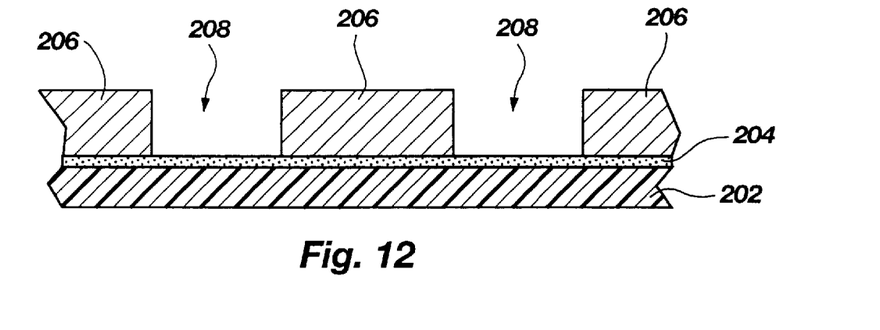
Figure 13:
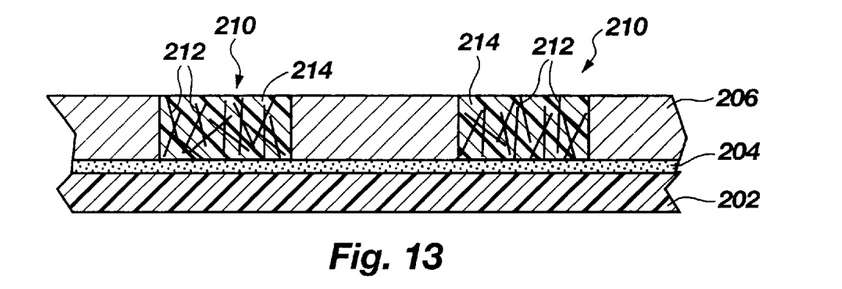
Figure 14:
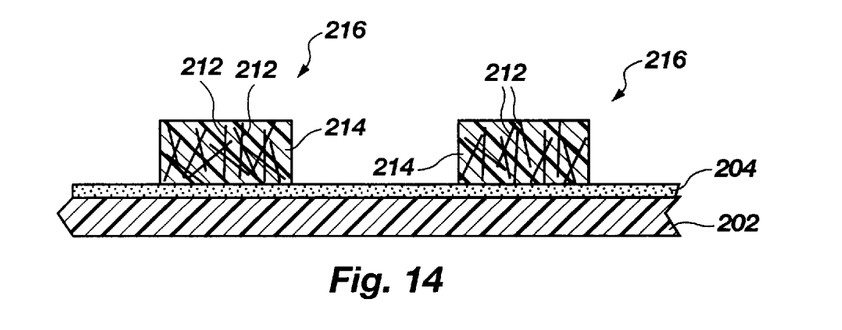

FIGS. 11–20 illustrate cross-sectional views of an alternate method of forming conductive interconnects utilizing a conductive interconnection carrier. FIG. 11 illustrates an interconnection carrier 200 comprising a carrier film 202 having a layer of release material 204, such as a heat release adhesive (an adhesive which loses its adhesion when a threshold temperature is reached). A stencil 206 may be placed atop the release material 204 with at least one stencil aperture 208 in a predetermined location, as shown in FIG. 12. An adhesive material 210, comprising ferromagnetic particles 212 dispersed within a matrix material 214, is deposited into the stencil apertures 208, such as by screen printing or spraying, as shown in FIG. 13. The stencil 206 is removed, thereby forming adhesive material columns 216, as shown in FIG. 14.

Figure 15:
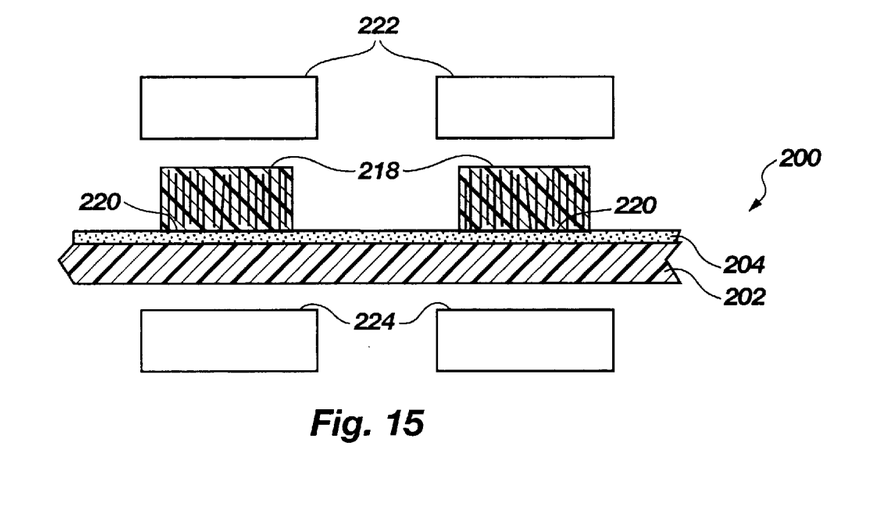
Figure 16:
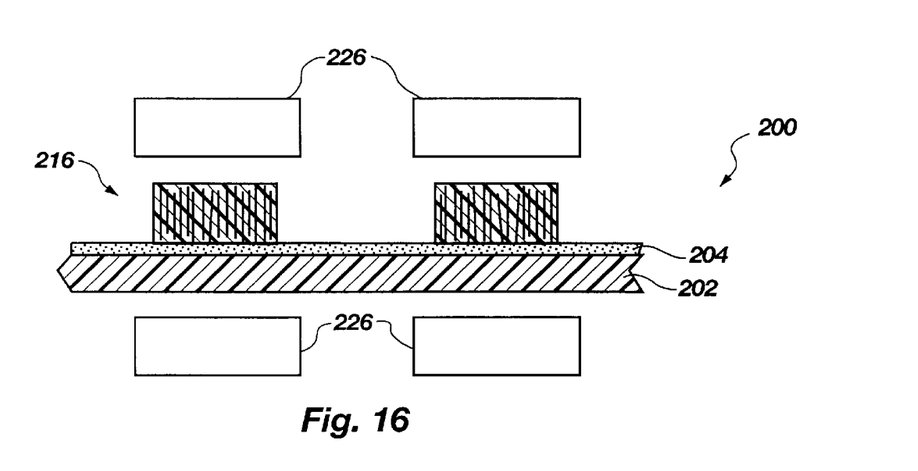

A magnetic field is applied between exposed surfaces 218 of the material columns 216 and attached surfaces 220 of the adhesive material columns 216 (abutting the release material 204), such as by at least one first magnetic pole 222 and at least one second, opposing magnetic pole 224, to align the ferromagnetic particles 212 perpendicular to the plane of the carrier film 202 within the matrix material 214, as shown in FIG. 15. Preferably, the matrix material 214 is at least partially cured to maintain the alignment of the ferromagnetic particles 212 within the matrix material 214. When a "hard" magnetic material (a material which retains a residual electromagnetic field generated from the alignment) is used for the ferromagnetic particles 212, the interconnection carrier 200 with the adhesive material columns 216 may be placed in at least one degaussing mechanism 226 which removes any residual magnetic field in the ferromagnetic particles 212, as shown in FIG. 16. When a "soft" magnetic material is used for the ferromagnetic particles 212, no degaussing is required because the residual electromagnetic field in the ferromagnetic particles 212 is so weak that it should not interfere with the electronic functioning of any electronic components.

Figure 17:
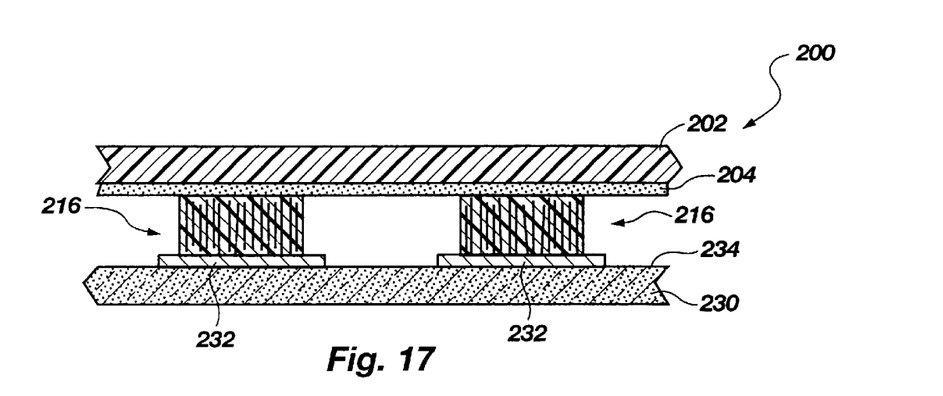
Figure 18:
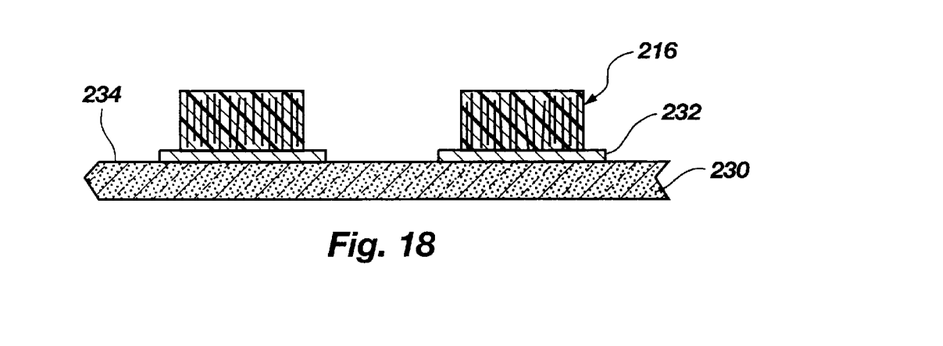

A first electronic component 230, such as a printed circuit board, a semiconductor wafer, a semiconductor chip, or the like, having at least one contact site, such as a bond pad 232, on an attachment surface 234 of the first electronic component 230 is provided and the adhesive material columns 216 attached to the interconnection carrier 200 are aligned over the first electronic component 230, as shown in FIG. 17. The resulting structure is heated such that the adhesive material columns 216 adhere to the bond pads 232 and the release material 204 ceases to adhere to the adhesive material columns 216, such that the carrier film 202 and release material 204 are removed, as shown in FIG. 18.

Figure 19:
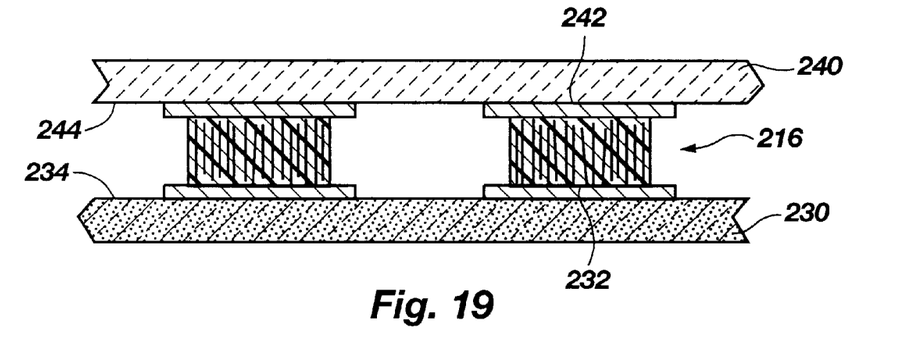

A second electronic component 240, such as a printed circuit board, a semiconductor wafer, a semiconductor chip, or the like, having at least one contact site, such as a bond pad 242, on an attachment surface 244 of the second electronic component 240 is then aligned over the adhesive material columns 216, as shown in FIG. 19.

Figure 20:
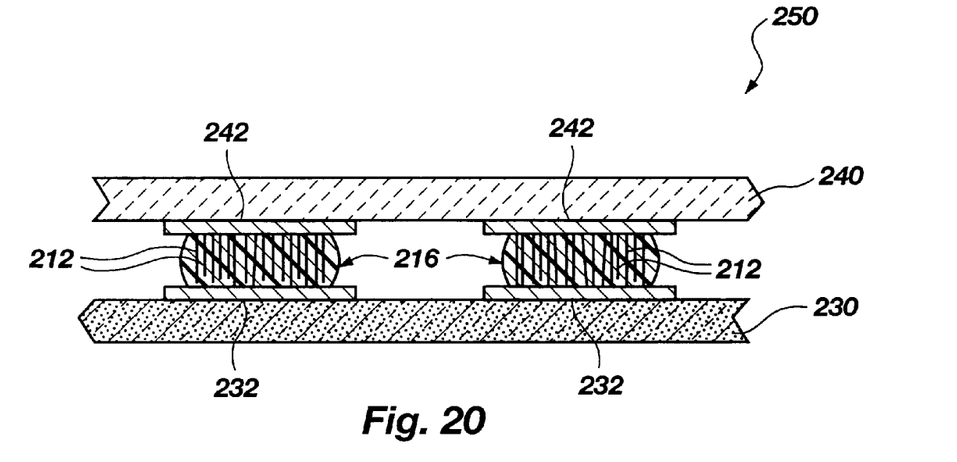

The first electronic component 230 and the second electronic component 240 are then pressed together such that a plurality of the ferromagnetic particles 212 of each adhesive material column 216 contacts or even slightly penetrates each first electronic component bond pad 232 and its corresponding second electronic component bond pad 242 to make a predetermined degree of electrical connection therebetween to form structure 250, as shown in FIG. 20. The distinct advantage of the present method is that the ferromagnetic particles 212 are aligned with a magnetic field prior to the adhesive material columns 216 being positioned between the electronic components 230, 240. Thus, any residual magnetic field in the ferromagnetic particles 212 of the adhesive material columns 216 can be removed prior to positioning and the electronic components 230, 240 will not be subjected to the magnetic field for aligning the ferromagnetic particles 212 as with previously described methods.

Figure 21:
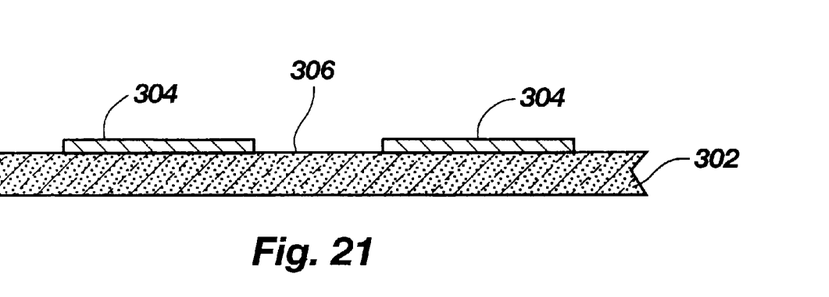
FIGS. 21–25 illustrate cross-sectional views of another method of forming a conductive interconnection between two electronic components according to the present invention.
Figure 22:
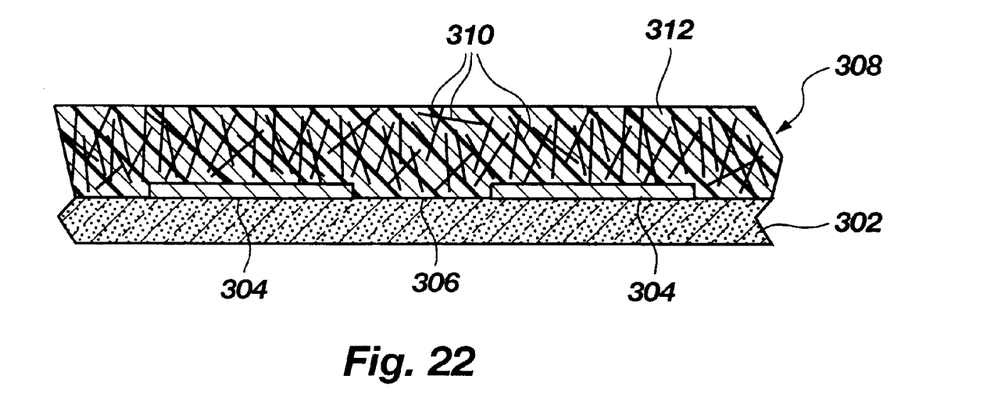
Figure 23:
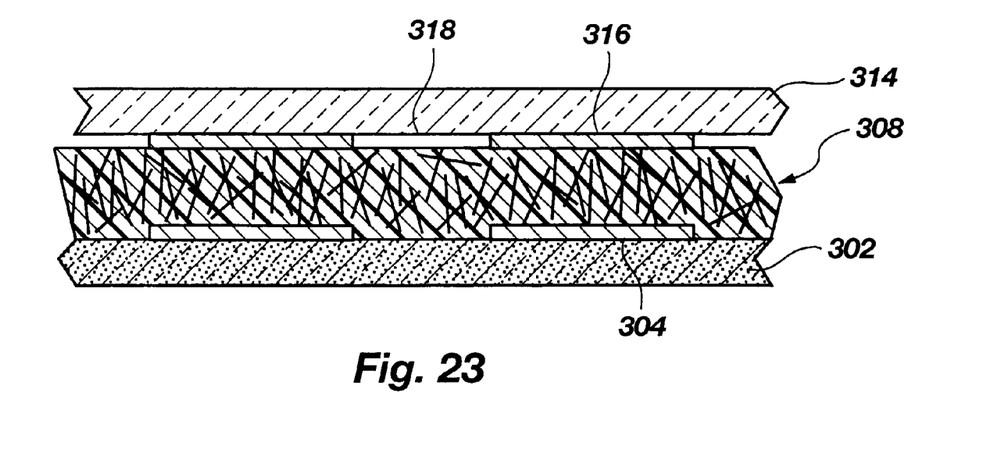
Figure 24:
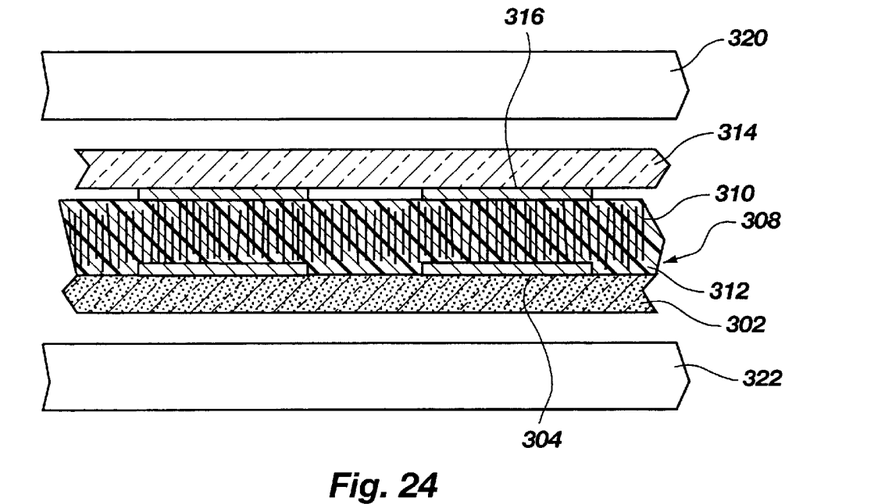

FIGS. 21–25 illustrate cross-sectional views of another method of forming conductive interconnects between two electronic components according to the present invention. FIG. 21 illustrates a first electronic component 302, such as a printed circuit board, a semiconductor wafer, a semiconductor chip, or the like, having at least one contact site, such as a bond pad 304, on an attachment surface 306 of the first electronic component 302. An adhesive material 308, comprising ferromagnetic particles 310 dispersed within a matrix material 312, is deposited over the first electronic component 302 and the bond pads 304, as shown in FIG. 22. A second electronic component 314, such as a printed circuit board, a semiconductor wafer, a semiconductor chip, or the like, having at least one contact site, such as a bond pad 316, on an attachment surface 318 of the second electronic component 314 is then placed over the adhesive material 308, such that corresponding bond pads 304 and 316 are aligned, as shown in FIG. 23. A magnetic field is applied between the first electronic component 302 and the second electronic component 314, such as by at least one first magnetic pole 320 and at least one second, opposing magnetic pole 322, to align the ferromagnetic particles 310 within the matrix material 312, as shown in FIG. 24.

Figure 25:
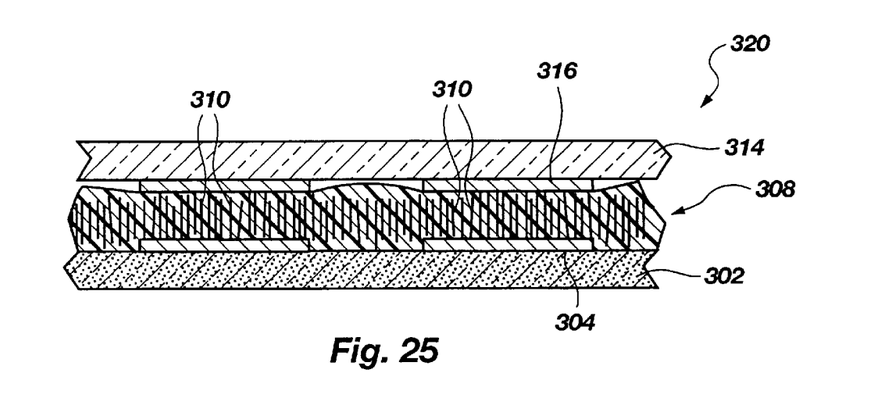

The first electronic component 302 and the second electronic component 314 are then pressed together such that a plurality of the ferromagnetic particles 310 in the adhesive material 308 between the aligned bond pads 304, 316 contacts or even slightly penetrates each first electronic component bond pad 304 and its corresponding second electronic component bond pad 316 to make a predetermined degree of electrical connection therebetween to form structure 320, as shown in FIG. 25.

Figure 26:
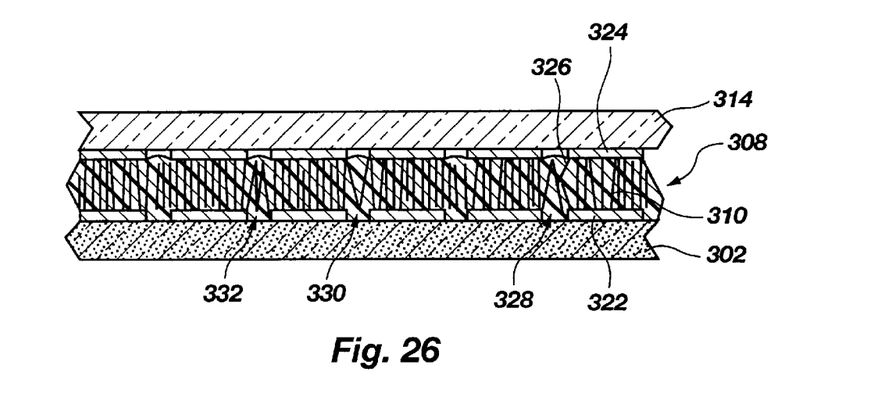
FIG. 26 illustrates an assembly of two electronic components having closely-spaced bond pads, interconnected according to the present invention

The method illustrated in FIGS. 21–25 will have functionality in applications in which the bond pads 304 on the first electronic component 302 and the bond pads 316 on the second electronic component 314 are sufficiently spaced apart. However, as shown in FIG. 26, when bond pads 322 of the first electronic component 302 and the bond pads 324 on the second electronic component 314 are tightly spaced, the potential exists for shorts between bond pads. For example, a ferromagnetic particle 310 may break under the pressure of bringing together the first electronic component 302 and the second electronic component 314. The broken portion 326, which is in contact with a bond pad 324, may contact a ferromagnetic particle 310 which is directly or indirectly in contact with an adjacent bond pad, shown as short 328. Two ferromagnetic particles 310, which are in contact with adjacent bond pads 324, may contact one another to form short 330. A random distribution of contacting ferromagnetic particles 310 may simply form a short 332. It is, of course, understood that such a shorting problem could be solve by fabricating columns of adhesive material 308 in a sleeve, such as a polyimide tube. The sleeve must be very thin so as to eliminate shorting but not inhibit compression of the column.

The ferromagnetic particles 114 utilized in the present invention are preferably elongated, flake or needle-shaped metal particles which contain electromagnetic dipoles that can be aligned under magnetic force. The ferromagnetic particles 114 are also preferably highly electrically conductive and highly resistant to oxidation. Possible candidates include nickel (Ni), cobalt (Co), iron (Fe), and alloys thereof with other metals and elements including, but not limited to, manganese (Mn), aluminum (Al), copper (Cu), titanium (Ti), boron (B), barium (Ba), sodium (Na), samarium (Sm), zirconium (Zr), and the like. Alternately, the ferromagnetic particles 114 can be formed by coating polymeric flakes or needles (such as polystyrene) or metal flakes or needles with ferromagnetic metals or alloys, in lieu of using solid ferromagnetic metal particles.

Applicable alloys include: $Co_{0.9}MnFe_{98.1}$, $Al_8Ni_{14}Co_{24}Cu_3Fe_{51}$, $Al_7Ni_{15}Co_{35}Cu_4Ti_5Fe_{34}$, $BaO.6Fe_2O_3$, $SmCo_5$, $Sm_2(Co,Cu,Fe,Zr)_{17}$, and $Na_{15}B_8Fe_{77}$. Although these alloys will work well, they do maintain a residual electromagnetic field after the magnetic alignment is complete. However, the electromagnetic field generated is so weak that it should not interfere with the electronic functioning of the electronic components. As noted above, the field can be removed when certain fabrication methods are employed.

The length of the ferromagnetic particles 114 is preferably less than or equal to the height 134 of the adhesive material columns 120 prior to compressing the first and second electronic components together, as shown in FIG. 7, and greater to or equal to the height 135 of the adhesive material columns 120 after compressing the first and second electronic components together, as shown in FIG. 8. It is also preferable that the length of the ferromagnetic particles 114 is less than or equal to the width of the adhesive material columns 120 to prevent the ferromagnetic particles 114 from extending from the side of the adhesive material columns 120 (i.e., preferably the column height is less than or equal to the column width). At present, for a flip-chip attachment-type arrangement with a bond pad size of about 4 mils wide, a particle length of about 1 mil is preferred. Although it is understood that the optimal particle length may vary for differing applications, useful particle length should range between about 0.016 mils (0.4 microns) and 4.7 mils (120 microns).

The ferromagnetic particles 114 comprise between about 10% and 90% of the adhesive material 112. This loading of ferromagnetic particles 114 will depend on the types of matrix material 116 and ferromagnetic particles 114 used. As a general concept, the use of "fine" or "thin" ferromagnetic particles results in a lower necessary loading of the ferromagnetic particles in the matrix material. The fine particles focus more load per unit of surface area on the tip of the particle. Thus, the fine particles will more easily penetrate the bond pad compared to thicker/blunter particles, thereby requiring fewer particles to achieve a substantive contact between bond pads. However, there is a balance between having the fine particles thin enough for easier penetration into the bond pads and having the fine particles thick enough so that the fine particles do not bend or break under axial loading. This balance can be determined by an individual skilled in the art knowing the properties of the ferromagnetic particles and the pressure or transverse force exerted on the first and second electronic components needed to achieve electrical contact by particle contact with or penetration of the bond pad surfaces.

The matrix material 116 should have a high moisture resistance (hydrophobic) and a low coefficient of thermal expansion mismatch to the first electronic component 102 and the second electronic component 124, as well as high strength, in order to resist cracking or other mechanical failure. The matrix material may be either a thermoset material, such as bisphenol A, F-type, or the like, a thermoplastic material, such as polyimide siloxane, or the like. Thermoplastic materials have an advantage of remaining at b-stage (i.e., an intermediate state of cure when the material is tacky and capable of further flow) on the first electronic component 102 until it is heated during magnetic particle alignment and the second electronic component 124 attachment. It is, of course, understood that solvents may be used to achieve certain rheological properties for dispensing or screen printing.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A conductive interconnection structure including a first electronic component, a second electronic component and an electrically conductive path therebetween, said electrically conductive path comprising a composite material including a plurality of elongated ferromagnetic particles each having a first and a second end, said elongated ferromagnetic particles being dispersed within a non-conductive matrix material, wherein at least some of said ferromagnetic particles are aligned to extend substantially transversely between and contact both said first electronic component and said second electronic component, and wherein at least one end of at least one of said at least some elongated ferromagnetic particles penetrates at least one of said first electronic component and said second electronic component.

2. The conductive interconnection structure of claim 1, further including at least one contact site on said first electronic component and at least one contact site on said second electronic component, wherein said at least some of said ferromagnetic particles are disposed between said at least one first electronic component contact site and said at least one second electronic component contact site, and wherein at least one end of at least one of said at least some elongated ferromagnetic particles penetrates at least one of said at least one first electronic component contact site and saidat least one second electronic component contact site.

3. The conductive interconnection structure of claim 1, wherein said elongated ferromagnetic particles are magnetically aligned.

4. The conductive interconnection structure of claim 1, wherein said elongated ferromagnetic particles are selected from the group comprising nickel, cobalt, iron and alloys thereof.

5. The conductive interconnection structure of claim 4, wherein said alloys include elements selected from the group comprising manganese, aluminum, copper, titanium, boron, barium, sodium, samarium, and zirconium.

6. The conductive interconnection structure of claim 1, wherein said elongated ferromagnetic particles comprise ferromagnetic materials or alloys thereof coated on polymers or other metals.

7. The conductive interconnection structure of claim 1, wherein said matrix material is selected from the group consisting of thermoplastic materials and thermoset materials.

8. A semiconductor device having at least one conductive interconnection formed between a first electronic component and a second electronic component, said conductive interconnection comprising a composite material including a plurality of elongated ferromagnetic particles each having a first and a second end, dispersed within a nonconductive matrix material, wherein at least some of said elongated ferromagnetic particles are aligned to extend substantially transversely between said first electronic component and said second electronic component to provide an electrically conductive path therebetween, and wherein at least one end of at least one of said at least some elongated ferromagnetic particles penetrates at least one of said first electronic component and said second electronic component.

9. The semiconductor device of claim 8, further including at least one contact site on said first electronic component and at least one contact site on said second electronic component, wherein said at least some of said ferromagnetic particles are disposed between said at least one first electronic component contact site and said at least one second electronic component contact site and penetrate at least one of said at least one first electronic component site and said at least one second electronic component contact site.

10. The semiconductor device of claim 8, wherein said elongated ferromagnetic particles are aligned by a magnetic field.

11. The semiconductor device of claim 8, wherein said elongated ferromagnetic particles are selected from the group comprising nickel, cobalt, iron, and alloys therefrom.

12. The semiconductor device of claim 11, wherein said alloys include elements selected from the group comprising manganese, aluminum, copper, titanium, boron, barium, sodium, samarium, and zirconium.

13. The semiconductor device of claim 8, wherein said elongated ferromagnetic particles comprise ferromagnetic materials or alloys thereof coated on polymers or other metals.

14. The semiconductor device of claim 8, wherein said matrix material is selected from the group consisting of thermoplastic materials and thermoset materials.

15. A method of forming a conductive interconnection, comprising:
   providing a first electronic component having at least one contact site;
   dispensing a composite material comprising a plurality of elongated ferromagnetic particles dispersed within a nonconductive matrix material on said at least one first electronic component contact site;
   positioning a second electronic component having at least one contact site such that said at least one second electronic component contact site substantially aligns with said at least one first electronic component contact site;
   forming a magnetic field between said first electronic component and said second electronic component to align at least some of said plurality of elongated ferromagnetic particles to extend substantially transversely between said at least one first electronic component contact site and said at least one second electronic component contact site; and
   compressing said first electronic component and said second electronic component together such that at least one of said at least some elongated ferromagnetic particles makes electrical contact between said at least one first electronic component contact site and said at least one second electronic component contact site and penetrates at least one of said at least one first electronic component contact site and said at least one second electronic component contact site.

16. The method of claim 15, wherein said elongated ferromagnetic particles are selected from the group comprising nickel, cobalt, iron, and alloys therefrom.

17. The method of claim 16, wherein said alloys include elements selected from the group comprising manganese, aluminum, copper, titanium, boron, barium, sodium, samarium, and zirconium.

18. The method of claim 15, wherein said elongated ferromagnetic particles comprise ferromagnetic materials or alloys thereof coated on polymers or other metals.

19. The method of claim 15, wherein said matrix material is selected from the group consisting of thermoplastic materials and thermoset materials.

20. A method of forming a semiconductor device having a conductive interconnection, said conductive interconnection formed by a method comprising:
   providing a first electronic component having at least one contact site;
   dispensing a composite material comprising elongated ferromagnetic particles each having a first end and a second end, dispersed within a nonconductive matrix material, on said at least one first electronic component contact site;
   aligning a second electronic component having at least one contact site such that said at least one first electronic component contact site substantially aligns with said at least one second electronic component contact site;
   forming a magnetic field between said first electronic component and said second electronic component to align at least some of said elongated ferromagnetic particles to extend substantially transversely between said at least one first electronic component contact site and said at least one second electronic component contact site; and
   compressing said first electronic component and said second electronic component together such that at least one of said at least some of said elongated ferromagnetic particles makes electrical contact between said at least one first electronic component contact site and said at least one second electronic component contact site, and at least one end of said at least one elongated ferromagnetic particle penetrates at least one of said at least one first electronic component contact site and said at least one second electronic component contact site.

21. The method of claim 20, wherein said elongated ferromagnetic particles are selected from the group comprising nickel, cobalt, iron, and alloys thereof.

22. The method of claim 21, wherein said alloys include elements selected from the group comprising manganese, aluminum, copper, titanium, boron, barium, sodium, samarium, and zirconium.

23. The method of claim 20, wherein said elongated ferromagnetic particles comprise ferromagnetic materials or alloys thereof coated on polymers or other metals.

24. The method of claim 20, wherein said matrix material is selected from the group consisting of thermoplastic materials and thermoset materials.

25. A method of forming a conductive interconnection, comprising:
   providing an interconnection carrier;
   dispensing a composite material comprising ferromagnetic particles dispersed within a nonconductive matrix material on said interconnection carrier;
   forming a magnetic field between an exposed surface of said composite material a surface of said composite material contacting said interconnection carrier to align a plurality of said ferromagnetic particles to extend substantially transversely between said exposed surface and said contacting surface to provide a plurality of electrically conductive paths therebetween; and
   at least partially curing said nonconductive matrix material such that said ferromagnetic particles remain substantially aligned therein.

26. The method of claim 25, wherein said ferromagnetic particles are selected from the group comprising nickel, cobalt, iron, and alloys thereof.

27. The method of claim 26, wherein said alloys include elements selected from the group comprising manganese, aluminum, copper, titanium, boron, barium, sodium, samarium, and zirconium.

28. The method of claim 25, wherein said ferromagnetic particles comprise ferromagnetic materials or alloys thereof coated on polymers or other metals.

29. The method of claim 25, wherein said matrix material is selected from the group consisting of thermoplastic, materials and thermoset materials.

30. The method of claim 25, further including degaussing said composite material after aligning said ferromagnetic particles in said magnetic field.

31. A method of forming a semiconductor device having a conductive interconnection, said conductive interconnection formed by a method comprising:

provi­ding an interconnection carrier;

dispensing a composite material comprising a plurality of elongated ferromagnetic particles dispersed within a nonconductive matrix material on said interconnection carrier;

forming a magnetic field between an exposed surface of said composite material and a surface of said composite material contacting said interconnection carrier to align at least some of said plurality of elongated ferromagnetic particles to extend substantially transversely between said exposed surface and said contacting surface;

at least partially curing said nonconductive matrix material such that said elongated ferromagnetic particles remain substantially aligned therein;

aligning said exposed surface of said at least one composite material over a first electronic component having at least one contact site and touching said contact site with said exposed surface of said composite material;

removing said interconnection carrier from said composite material;

positioning a second electronic component having at least one contact site over said composite material such that said at least one first electronic component contact site substantially aligns with said at least one second electronic component contact site; and compressing said first electronic component and said second electronic component together such that at least some of said plurality of elongated ferromagnetic particles make electrical contact between said at least one first electronic component contact site and said at least one second electronic component contact site, and wherein at least one of said at least some elongated ferromagnetic particles penetrates at least one of said at least one first electronic component site and said at least one second electronic component site.

32. The method of claim 31, wherein said elongated ferromagnetic particles are selected from the group comprising nickel, cobalt, iron, and alloys thereof.

33. The method of claim 32, wherein said alloys include elements selected from the group comprising manganese aluminum, copper, titanium, boron, barium, sodium, samarium, and zirconium.

34. The method of claim 31, wherein said elongated ferromagnetic particles comprise ferromagnetic materials or alloys thereof coated on polymers or other metals.

35. The method of claim 31, wherein said matrix material is selected from the group consisting of thermoplastic materials and thermoset materials.

36. The method of claim 31, further including depositing a heat release adhesive between said interconnection carrier and said composite material.

37. The method of claim 36, wherein said removing said interconnecting carrier includes heating said heat release adhesive.

38. The method of claim 31, further including degaussing said composite material after aligning said ferromagnetic particles in said magnetic field.

* * * * *

UNITED STATES PATENT AND TRADEMARK OFFICE
CERTIFICATE OF CORRECTION

PATENT NO : 6,011,307
DATED : January 4, 2000
INVENTOR(S) : Jiang et al.

It is certified that error appears in the above-identified patent and that said Letters Patent is hereby corrected as shown below:

|  | Column 2, | line 22, | change "plastic filled" to --plastic-filled--; |
|---|---|---|---|
|  | Column 4, | line 58, | delete the "," after "Since"; |
|  | Column 5, | line 23, | insert --DETAILED-- before "DESCRIPTION"; |
|  | Column 6, | lines 19-20, | change "ther-ebetween" to be hyphenated at --there-between--; |
|  | Column 7, | lines 44-45, | change "ther-ebeteween" to be hyphenated at --there-between--; |
|  | Column 8, | line 60, | change formula "$BaO.6Fe_2O_3$" to -- $BaO·6Fe_2O_3$ --; |
| Claim 2, | Column 10, | line 22, | insert space between "saidat" so that it appears as --said at--; |
| Claim 31, | Column 13, | line 19, | after said (2nd occurrence) delete "at least one"; |
| Claim 31, | Column 13, | line 21, | after "said" insert --at least one--; and |
| Claim 37, | Column 14, | line 26, | change "interconnecting" to --interconnection--. |

Signed and Sealed this

Thirteenth Day of March, 2001

*Attest:*

NICHOLAS P. GODICI

*Attesting Officer*     *Acting Director of the United States Patent and Trademark Office*